United States Patent [19]
Kawaguchi et al.

[11] Patent Number: 5,963,140
[45] Date of Patent: Oct. 5, 1999

[54] REMAINING BATTERY ENERGY INDICATING INSTRUMENT

[75] Inventors: Kenji Kawaguchi; Masayuki Toriyama, both of Saitama, Japan

[73] Assignee: Honda Giken Kogyo Kabushiki Kaisha, Tokyo, Japan

[21] Appl. No.: 08/785,955

[22] Filed: Jan. 22, 1997

[30] Foreign Application Priority Data

Jan. 22, 1996 [JP] Japan .................................. 8-008564

[51] Int. Cl.⁶ .................................................. G08B 5/00
[52] U.S. Cl. .................. 340/815.58; 340/636; 324/433; 320/127; 320/136; 320/48
[58] Field of Search .............................. 340/636, 815.58; 324/433, 435; 320/48, 127, 136; 429/90, 92

[56] References Cited

U.S. PATENT DOCUMENTS

| | | | |
|---|---|---|---|
| 3,680,072 | 7/1972 | Charbonnier et al. | 324/433 X |
| 3,886,442 | 5/1975 | Chiku et al. | 324/29.5 |
| 4,151,454 | 4/1979 | Iida | 340/636 X |
| 4,234,840 | 11/1980 | Konrad et al. | 320/48 |
| 4,560,937 | 12/1985 | Finger | 324/433 |
| 5,115,182 | 5/1992 | Ehmke et al. | 320/14 |
| 5,325,041 | 6/1994 | Briggs | 320/44 |
| 5,477,129 | 12/1995 | Myslinski | 340/636 X |

FOREIGN PATENT DOCUMENTS

| | | |
|---|---|---|
| 0425044 A1 | 10/1990 | European Pat. Off. . |
| 0600234 A2 | 6/1994 | European Pat. Off. . |
| 59-5975 | 1/1984 | Japan . |
| 2245781 | 1/1992 | United Kingdom . |

OTHER PUBLICATIONS

Patent Abstracts of Japan, Japan, vol. 012, No. 019 (P–657), Jan. 21, 1988 and JP 62 175680A Jan. 08.

*Primary Examiner*—Jeffery A. Hofsass
*Assistant Examiner*—Anh La

[57] ABSTRACT

A remaining battery energy indicating instrument with a reduced integration error even if a battery is repeatedly charged and discharged without being fully discharged. A remaining battery energy indicating instrument has a detecting member for detecting a predetermined discharged time and a predetermined fully charged time of a battery for storing electric energy, an integrating member for integrating electric energy which has been charged and discharged, while regarding as an integrated value a value corresponding to an amount of electric energy stored in the battery at the predetermined discharged time and the predetermined fully charged time when the predetermined discharged time and the predetermined fully charged time are reached. A display device is provided for displaying the absolute value of a remaining amount of electric energy stored in the battery based on an output signal from said integrating member.

20 Claims, 7 Drawing Sheets

DISCHARGE RATE CORRECTION PROCESS

SELF-DISCHARGE CORRECTION

TEMPERATURE CORRECTION

REMAINING BATTERY ENERGY INDICATING INSTRUMENT

BACKGROUND OF THE INVENTION

1. Field of the Invention

The present invention relates to a remaining battery energy indicating instrument for a battery for storing electric energy. More particularly, to a remaining battery energy indicating instrument for integrating an amount of electric energy which has been charged and discharged, with respect to a predetermined discharged time and a predetermined fully charged time, thereby to reduce an integration error.

2. Description of Background Art

One conventional remaining battery energy device, as disclosed in Japanese Patent Laid-open No. Sho 59-5975, provides an indicating instrument for a battery which integrates electric energy which has been charged and discharged, with respect to a reference value which is the amount of electric energy at the time the discharging of the battery is completed, and displays the remaining amount of electric energy.

One energy display scheme is an absolute value display process which displays the absolute value of a remaining amount of electric energy with respect to a graduation which corresponds to a predetermined amount of electric energy, e.g., of 0.8 Ah.

Another energy display arrangement is a relative value display process which displays the relative value of a remaining amount of electric energy in ratios with respect to a battery capacity of 100%, the ratios being indicated by graduations each representing 20%.

SUMMARY AND OBJECTS OF THE INVENTION

The capacity of batteries vary due to repeated charging and discharging cycles and aging. According to the absolute value display process, when the battery capacity is large, each graduation corresponds to 1 Ah, for example, and the amount of electric energy corresponding to each graduation is reduced slowly. When the battery capacity is small, on the other hand, each graduation corresponds to 0.8 Ah, for example, and the amount of electric energy corresponding to each graduation is reduced quickly.

Therefore, the relative value display process has a disadvantage in that the user of an electrically operated apparatus which uses such a battery as an energy power source is unable to recognize easily the remaining operating time or work of the electrically operated apparatus from the graduated display of the remaining amount of electric energy. For example, the driver of an electric vehicle cannot estimate the distance which the electric vehicle can travel from the graduated display of the remaining amount of electric energy.

The remaining battery energy indicating instrument which integrates electric energy which has been charged and discharged, with respect to a reference value which is the amount of electric energy at the time the discharging of the battery is completed, and displays a remaining amount of electric energy can accurately display the remaining amount of electric energy if the battery is to be charged from the discharge-completed time when the battery is used up. However, if the battery is repeatedly charged and discharged though it still stores a remaining amount of electric energy, then the remaining battery energy indicating instrument suffers an integration error, and may not be able to accurately display the remaining amount of electric energy.

This is because the integrated value representing the history of the battery and corresponding to the remaining amount of electric energy tends to be inaccurate due to various corrective factors. Therefore, the conventional remaining battery energy indicating instrument, if used with an electrically operated apparatus which does not use up the electric energy stored in the battery in each work cycle, is problematic in that integration errors are accumulated, making it difficult to recognize a present accurate remaining amount of electric energy stored in the battery and a remaining operating time, etc. of the electrically operated apparatus.

For example, the remaining conventional battery energy indicating instrument, if used with a power-assisted bicycle or an electric vehicle which does not use up the electric energy stored in the battery in each work cycle, undergoes a shortcoming in that integration errors are accumulated, making it difficult for the user to recognize a present accurate remaining amount of electric energy stored in the battery and the distance which the bicycle or the electric vehicle can travel.

Electric energy such as an electric charge, electric current, electric power, or the like is integrated based on the electric current that flows into or out of the battery. Therefore, even if a battery charger is connected to the battery and the battery is actually fully charged, any electric current that flows into the battery is further integrated, causing the integrated value to fail to represent the actually charged amount of electric energy.

One meter for displaying the remaining amount of electric energy stored in a battery comprises a moving-coil meter which displays the remaining amount of electric energy with an indicating pointer. The moving-coil meter cannot be reduced in size because it needs a space in which the indicating pointer turns.

This problem manifests itself if the battery is used as a removable battery on a power-assisted bicycle for which the appearance is important and which has a limited area for the installation of the meter.

The present invention has been made in an effort to solve the above problems. A first object of the present invention is to display a remaining amount of electric energy stored in a battery with a reduced integration error even if the battery is repeatedly charged and discharged without being fully discharged in each cycle.

A second object of the present invention is to minimize an integration error when a battery is fully discharged even if an electric current flows into the battery from a battery charger that is connected to the battery when it is fully discharged.

A third object of the present invention is to display the remaining amount of electric energy stored in a battery without being affected by changes in the capacity of the battery.

Another object of the present invention is to provide a remaining battery energy indicating instrument capable of displaying the remaining amount of electric energy stored in a battery while occupying a small space.

The remaining battery energy indicating instrument according to the present invention includes a detecting means for detecting a predetermined discharged time and a predetermined fully charged time of a battery for storing electric energy, integrating means for integrating electric energy which has been charged and discharged, while regarding as an integrated value a value corresponding to an amount of electric energy stored in the battery at the predetermined discharged time and the predetermined fully charged time when the predetermined discharged time and the predetermined fully charged time are reached. Display means are provided for displaying the absolute value of a remaining amount of electric energy stored in the battery based on an output signal from the integrating means.

Since the integrating means integrates the electric energy with respect to the fully charged time when the battery is charged or discharged from the fully charged time, and integrates the electric energy with respect to the discharged time when the battery is charged or discharged from the discharged time, the integrating means can start integrating the electric energy which has been charged and discharged from an accurate integrated value at the fully charged time or discharged time.

Therefore, an integration error may be reduced as compared to only using the discharge completion time as a reference in a battery which is fully charged more often than fully discharged.

Since the display means displays the absolute value of the remaining amount of electric energy stored in the battery based on an output signal from the integrating means, the user of an electrically operated apparatus which uses the battery as an energy power source is able to recognize easily the remaining operating time or the like of the electrically operated apparatus.

In a remaining battery energy indicating instrument according to the present invention, the integrating means stops integrating the electric energy when the detecting means detects the amount of electric energy stored in the battery as being equal to or greater than the amount of electric energy stored in the battery at the fully charged time.

Even if a battery charger remains connected to the battery for a long period of time while the battery is being fully charged and an electric current flows into the battery, the integrated value is fixed to a value which corresponds to the amount of charged electric energy at the fully charged time. An error of the integrated value in the fully charged state is thus held to a value equal to or smaller than the difference between the amount of charged electric energy at the fully charged time and the battery capacity.

In a remaining battery energy indicating instrument according to the present invention, the display means comprises a bar-graph meter for displaying an amount of electric energy equal to or smaller than the amount of electric energy stored in the battery at the fully charged time.

The display means displays an amount of electric energy equal to or smaller than the amount of electric energy stored in the battery at the predetermined fully charged time. Therefore, even when the capacity of the battery varies in a range equal to or greater than the amount of electric energy at the fully charged time, the display means can display the remaining amount of electric energy stored in the battery without being affected by the variation.

Inasmuch as the remaining amount of electric energy in the battery is displayed with a bar-graph meter, the space required for display is small in size, and the user of an electrically operated apparatus can visually recognize quickly an approximate value of the remaining amount of electric energy in the battery. The user can easily recognize the remaining operating time of the electrically operated apparatus before or while the electrically operated apparatus operates.

In a battery according to the present invention, a remaining battery energy indicating instrument includes a battery for storing electric energy for producing power for an electrically-operated vehicle. Therefore, an integration error may be considerably smaller than if only the discharge completion time is used as a reference in the battery which is fully charged more often than fully discharged.

Since the display means displays the absolute value of the remaining amount of electric energy in the battery, the driver of an electric vehicle can easily recognize the distance that the electric vehicle can travel before or while the driver drives the electric vehicle.

If the remaining amount of electric energy in the battery is displayed by a bar-graph meter, then the space required for display is small in size. Therefore, a space for installing the remaining battery energy indicating instrument according to the present invention can easily be kept in an electric vehicle which has a limited area for the installation of the meter.

For example, a space for installing the remaining battery energy indicating instrument according to the present invention can easily be kept in a detachable battery or a battery case assembly on a power-assisted bicycle for which the appearance is important and which has a limited area for the installation of the meter.

If the remaining amount of electric energy in the battery is displayed by a bar-graph meter, then the driver of the electric vehicle can visually recognize quickly an approximate value of the remaining amount of electric energy in the battery, and can easily recognize the distance that the electric vehicle can travel while the driver is driving the electric vehicle.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
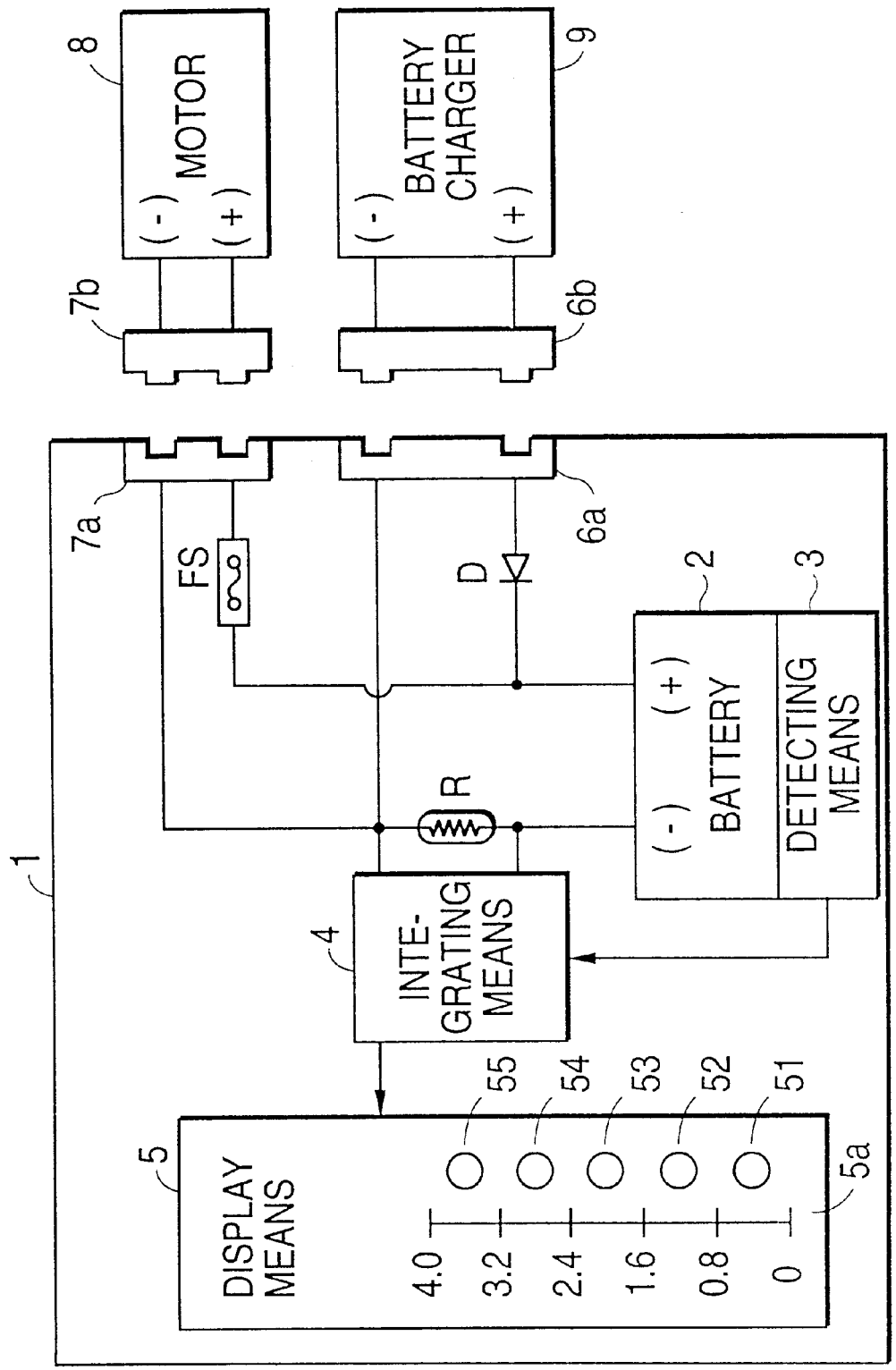
FIG. 1 is a block diagram of a remaining battery energy indicating instrument according to the present invention.

The present invention will hereinafter be described below based on an embodiment shown in the drawings. As shown in FIG. 1, a remaining battery energy indicating instrument 1 according to the present invention comprises a detecting means 3 for detecting a predetermined discharged time and a predetermined fully charged time of a battery 2 for storing electric energy for a power-assisted bicycle. An integrating means 4 is provided for integrating electric energy which has been charged and discharged, while regarding as an integrated value a value corresponding to an amount of electric energy stored in the battery at the predetermined discharged time and the predetermined fully charged time when the predetermined discharged time and the predetermined fully charged time are reached. A display means 5 is provided for displaying the absolute value of a remaining amount of electric energy stored in the battery based on an output signal from the integrating means 4.

The remaining battery energy indicating instrument 1 also has a resistor R, a diode D, a fuse FS, and connectors 6a, 7a.

The battery 2 has a negative terminal connected through the resistor R to a terminal of the connector 7a and a terminal of the connector 6a. The battery 2 has a positive terminal (+) connected through the fuse FS to another terminal of the connector 7a and through the diode D to another terminal of the connector 6a.

The detecting means 3 detects (E (empty) detection) the predetermined discharged time from the voltage across the battery 2, and outputs a detected-signal indicative of the predetermined discharged time to the integrating means 4. The detecting means 3 also detects (F (full) detection) the predetermined fully charged time from the temperature of the battery 2, and outputs a detected signal indicative of the predetermined fully charged time to the integrating means 4. For example, the detecting means 3 comprises a comparator for comparing the voltage across the battery 2 and a preset voltage, and a temperature sensor.

The detecting means 3 may compare a digital value converted from the voltage across the battery 2 through an A/D converter, with a preset value to detect the predetermined discharged time.

In response to the detected signal from the detecting means 3, the integrating means 4 regards as an integrated value a value corresponding to an amount of electric energy stored in the battery at the predetermined discharged time and the predetermined fully charged time, and integrates an electric current as electric energy which has been charged and discharged. The integrated value is produced by integrating the electric current with respect to time, and is expressed in Ah (ampere-hour).

The electric current flowing into or out of the battery 2 is converted into a voltage by the resistor R for detection. For example, the integrating means 4 comprises an A/D converter for converting the analog voltage across the resistor R into a digital value, and a microcomputer having an integrating function.

The integrating means 4 may comprise an analog integrating circuit comprising a capacitor, a resistor, and an operational amplifier. The display means 5 comprises a bar-graph meter and has a plurality of display elements 51–55 for displaying an amount of electric energy equal to or smaller than the amount of electric energy stored in the battery 2 at the fully charged time. Each of the display, elements 51–55 comprises an LED.

The display means 5 also has graduations 5a marked with respective numerical values 0 Ah, 0.8 Ah, 1.6 Ah, 2.4 Ah, 3.2 Ah, and 4.0 Ah. The amount of electric energy stored in the battery 2 at the fully charged time is 4.0 Ah.

The display means 5 displays the absolute value of the remaining amount of electric energy stored in the battery 2 through energization of the LEDs of the display elements 51–55 based on an output signal representative of an integrated value from the integrating means 4. For example, the display means 5 has an LED matrix control circuit for energizing or blinking the LEDs.

A motor 8 has a negative terminal (−) connected to a terminal of the connector 7b and a positive terminal connected to another terminal of the connector 7b. The connectors 7a, 7b are so shaped as to be complementarily fitted with each other. Power for an electrically operated vehicle such as a power-assisted bicycle is supplied from the motor 8.

A battery charger 9 has a negative terminal connected to a terminal of the connector 6b and a positive terminal (+) connected to another terminal of the connector 6b. The connectors 6a, 6b are so shaped as to be complementarily fitted with each other.

Figure 2:
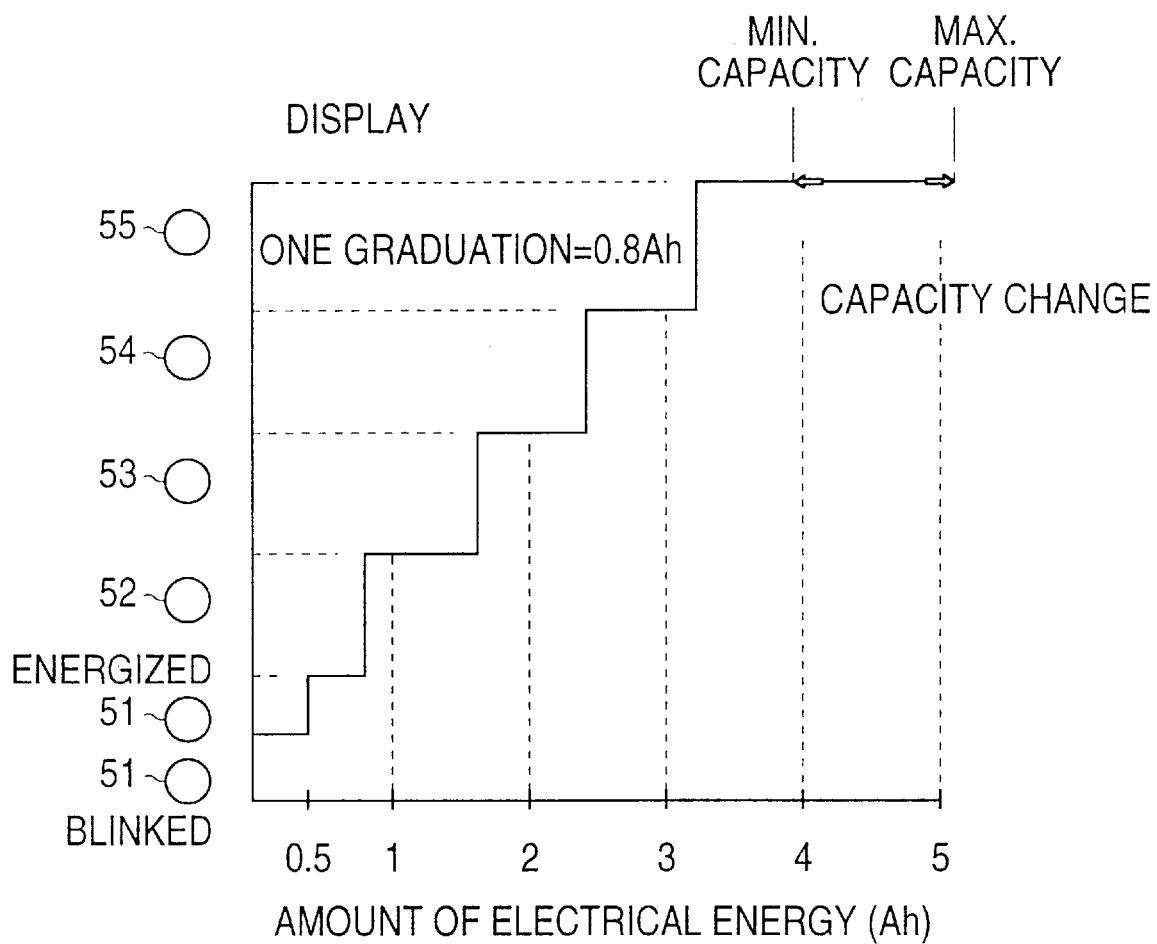
FIG. 2 is a diagram showing remaining energy display characteristics of the remaining battery energy indicating instrument according to the present invention.
Figure 3:
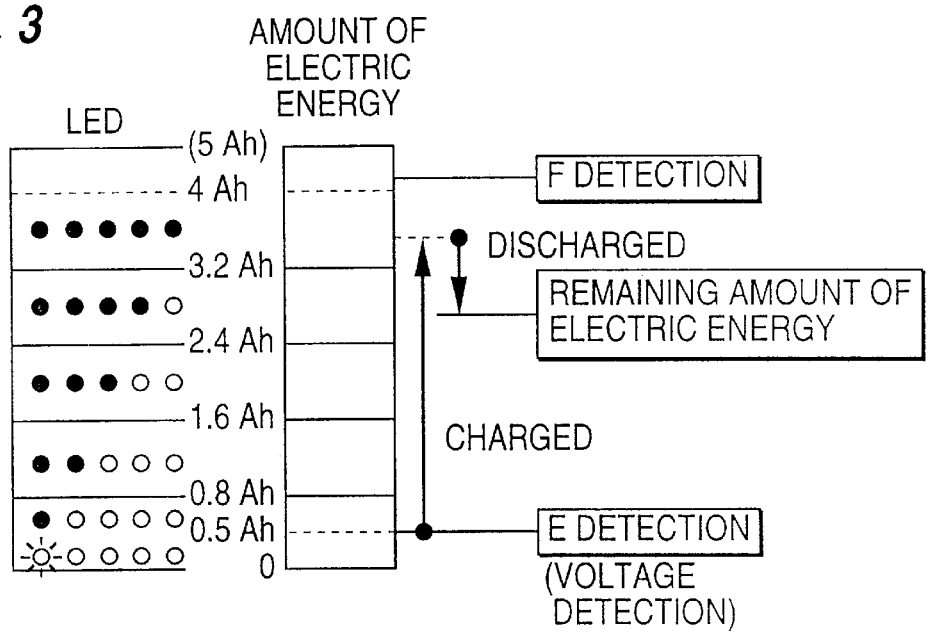
FIG. 3 is a diagram showing the manner in which a remaining amount of energy is displayed by the remaining battery energy indicating instrument according to the present invention.

In FIGS. 3 and 2, the LEDs are energized or blinked as follows:

The LED of the display element 51 is blinked when the remaining amount of electric energy stored in the battery 2 is greater than 0.0 Ah and equal to or smaller than 0.5 Ah.

The LED of the display element 51 is energized when the remaining amount of electric energy stored in the battery 2 is greater than 0.5 Ah and equal to or smaller than 0.8 Ah.

The LED of the display element 52 is energized when the remaining amount of electric energy stored in the battery 2 is greater than 0.8 Ah and equal to or smaller than 1.6 Ah.

The LED of the display element 53 is energized when the remaining amount of electric energy stored in the battery 2 is greater than 1.6 Ah and equal to or smaller than 2.4 Ah.

The LED of the display element 54 is energized when the remaining amount of electric energy stored in the battery 2 is greater than 2.4 Ah and equal to or smaller than 3.2 Ah.

The LED of the display element 55 is energized when the remaining amount of electric energy stored in the battery 2 is greater than 3.2 Ah and equal to or smaller than 4.0 Ah.

If the distance that the power-assisted bicycle can travel is 3 km/0.8 Ah, then the energization of one LED is converted into one graduation, i.e., 3 km/graduation, allowing the user to recognize the distance that the power assisted bicycle can travel easily from the displayed remaining amount of electric energy stored in the battery 2 based on a proportional relationship.

The LED of the display element 55 is also energized when the remaining amount of electric energy stored in the battery 2 is greater than 4.0 Ah and equal to or smaller than 5.0 Ah. The amount of electric energy stored in the battery 2 at the fully charged time is 4.0 Ah, and when the amount of charged electric energy ranges from 4.0 to 5.0 Ah, the battery 2 is in a fully charged state.

Even when the battery capacity or the chargeable capacity of the battery in each cycle varies in the range from 4.0 to 5.0 Ah, the uppermost display element 55 for displaying the fully charged state can absorb the variation and display the fully charged state.

Figure 4:
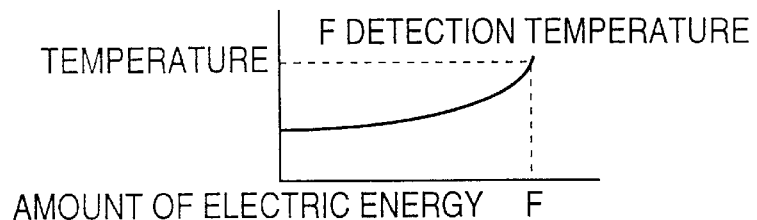
FIG. 4 is a diagram showing the relationship between the charged amount of electric energy in a battery and the temperature of the battery.

After the battery 2 starts being charged from a fully discharged state, the temperature of the battery 2 increases as it approaches the fully charged state. When the rate of increase of the temperature or the temperature reaches a predetermined value (F detection temperature), then the detecting means 3 detects the fully charged state, and also detects the time at which the fully charged state is detected as a predetermined fully charged time (F detection time). The relationship between the charged amount of electric energy in the battery and the temperature of the battery is shown in FIG. 4. The letter F in FIG. 4 corresponds to 4.0 Ah.

When the battery 2 is charged closely to the battery capacity, even if an electric current flows from the battery charger 9 into the battery 2, the electric energy carried by the electric current is substantially not charged in the battery 2.

Therefore, when the detecting means 3 detects the amount of electric energy stored in the battery 2 as being equal to or greater than the amount of electric energy stored in the battery 2 at the fully charged time, the integrating means 4 receives a detected signal indicative of that state, stops integrating the electric current, and substitute the amount of charged electric energy at the fully charged time as a reference value into the integrated value, making the integrated value equal to 4.0.

Consequently, even if the battery charger remains connected to the battery 2 for a long period of time while the battery 2 is being fully charged, the integrated value corresponds to the amount of charged electric energy at the fully charged time. An error of the integrated value in the fully charged state is thus held to a value equal to or smaller than the difference between the battery capacity and the amount of charged electric energy at the fully charged time.

When the battery 2 is discharged through energization of the motor 8, the integrating means 4 subtracts a discharged amount of electric energy from the integrated value.

When the battery 2 is gradually discharged from the fully charged state, since the amount of electric energy stored in the battery 2 at the fully charged time is used as an integrated time when the fully charged time is reached and the electric current starts being integrated when the amount of electric energy stored in the battery 2 becomes smaller than the amount of electric energy stored in the battery 2 at the fully charged time, the amount of electric energy can start being integrated from the accurately integrated value.

When the battery 2 is further discharged, the displayed graduations are gradually reduced until only the LED of the display element 51 is energized. When the voltage across the battery 2 reaches a predetermined value (E detection voltage), the detecting means 3 detects that the discharging completion is close, and also detects the time at which the discharging completion is close as the predetermined discharged time (E detection time).

Figure 5:
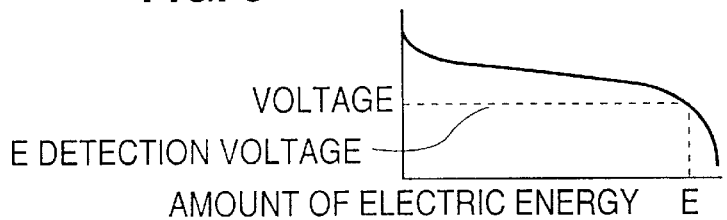
FIG. 5 is a diagram showing the relationship between the voltage across the battery and the remaining amount of electric energy in the battery.

The LED of the display element 51 switches to blinking, and the integrated value is set to the amount of electric energy stored in the battery 2 at the predetermined discharged time, i.e., 0.5. The relationship between the voltage across the battery 2 and the remaining amount of electric energy in the battery 2 is shown in FIG. 5. The letter E in FIG. 5 corresponds to 0.5 Ah.

The electric current that is integrated (added or subtracted) may be corrected based on the temperature of the battery or the like. It may be corrected by a discharge rate correction process, a self-discharge correction process, or a temperature correction process.

Figure 6A:
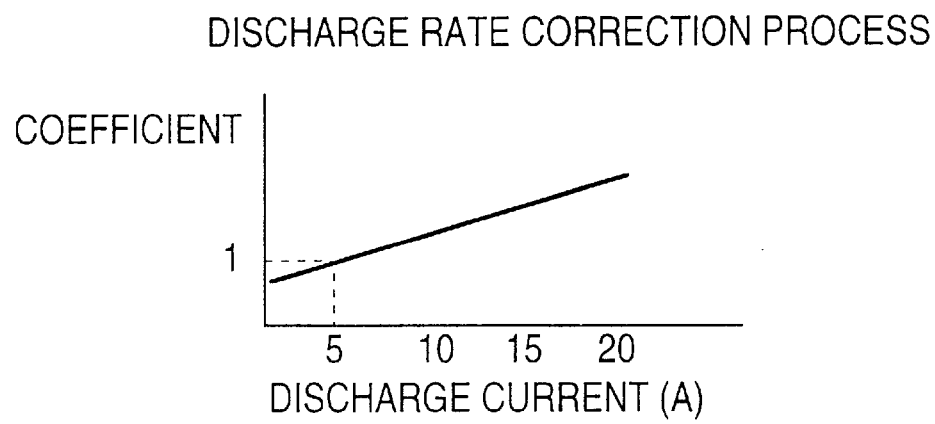
FIG. 6(a) is a diagram illustrative of the discharge rate correction process.

FIG. 6(a) is a diagram illustrative of the discharge rate correction process. According to the discharge rate correction process, the electric current is counted as a larger value as the electric current discharged from the battery 2 is greater.

Figure 6B:
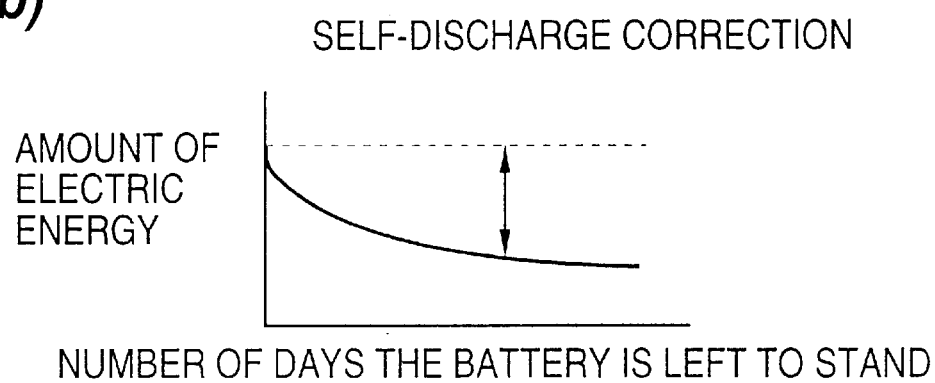
FIG. 6(b) is a diagram illustrative of the self-discharge correction process.

FIG. 6(b) is a diagram illustrative of the self-discharge correction process. When the battery 2 is charged and then left to stand, the battery 2 is self-discharged. According to the self-discharge correction process, the amount of self-discharged electric energy is subtracted from the integrated value.

Figure 6C:
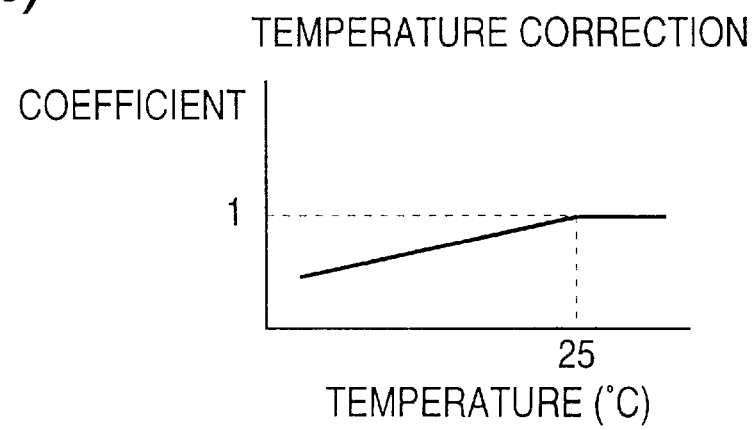
FIG. 6(c) is a diagram illustrative of the temperature correction.

FIG. 6(c) is a diagram illustrative of the temperature correction process. According to the temperature correction process, the temperature of the battery is detected to correct the integrated value based thereon.

When the temperature of the battery is lower, the integrated value is estimated as being smaller. The remaining battery energy indicating instrument may be simple in structure since it integrates the electric current without taking into account variations in the voltage. The remaining battery energy indicating instrument is suitable for use on a small-size electrically operated vehicle in particular.

Figure 7:
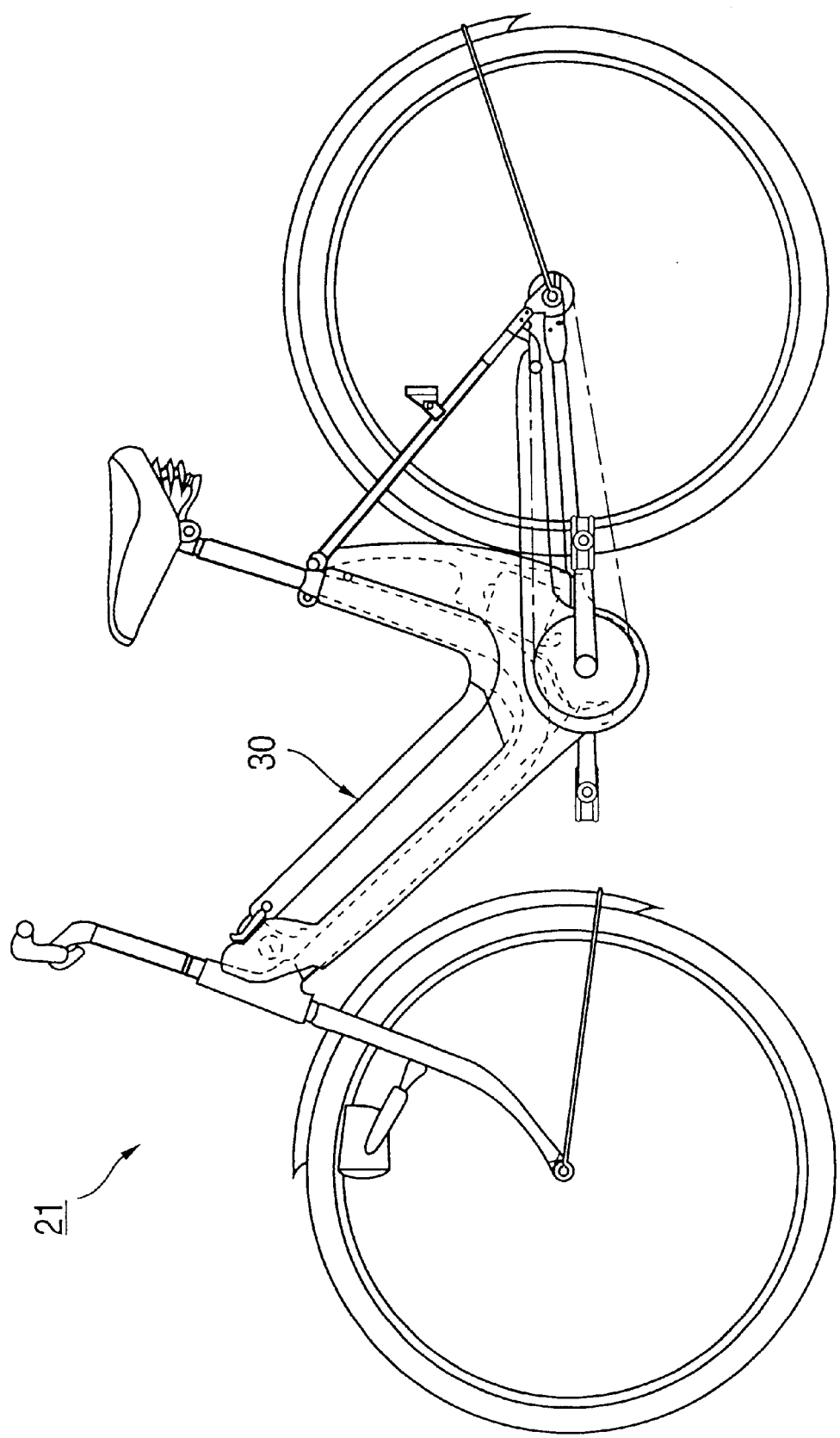
FIG. 7 is a view of a power-assisted bicycle.
Figure 8:
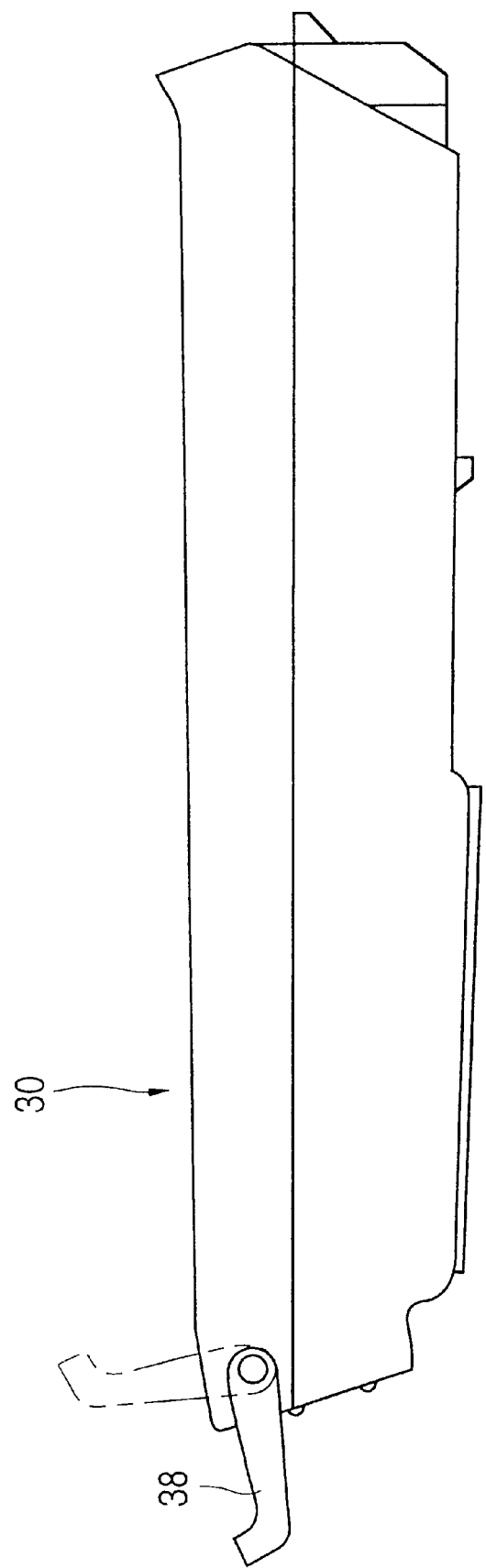
FIG. 8 is a view of a battery case assembly of the power-assisted bicycle.
Figure 9:
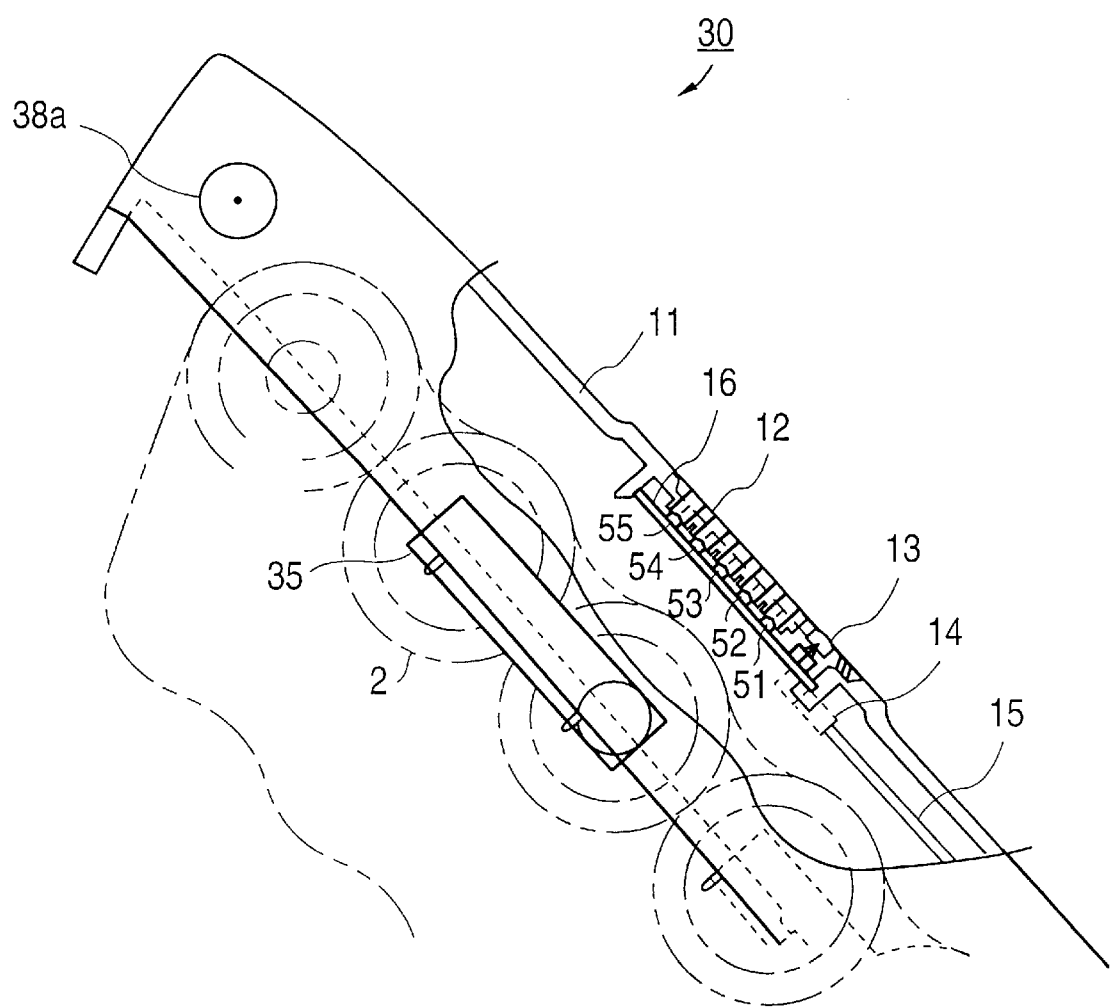
FIG. 9 is a view showing a layout of the remaining battery energy indicating instrument according to the present invention.

FIG. 7 is a view of a power-assisted bicycle 21 with a battery 30 connected thereto. FIG. 8 is a view of a battery case assembly 30 of the power-assisted bicycle. FIG. 9 is a cross-sectional view of an upper portion of the battery case assembly 30 shown in FIG. 8 with a handle 38 being connected thereto.

As illustrated in FIG. 9, a remaining battery energy indicating instrument is incorporated in the battery case assembly 30, and batteries 2 are fitted in a fixed arrangement in a battery case 11 to which a circuit board 16 is secured. Information displayed by the display elements 51–55 is visible on a surface of the battery case 11, and a display button 13 is disposed on the surface of the battery case 11. To suppress electric power consumption, the remaining amount of electric energy stored in the batteries 2 is displayed by the display elements 51–55 when the display button 13 is pressed. A PVC film 12 is bonded to the surface of the battery case 11 over the display elements 51–55 which are fixedly mounted on the circuit board 16 and the upper surface of the display button 13.

The circuit board 16 and the integrating means (not shown) are connected to each other by a coupler 14 and a harness 15. The remaining battery energy indicating instrument is incorporated in the battery case assembly 30 which is removable from the power-assisted bicycle, so that the remaining amount of electric energy stored in the batteries 2 can be monitored on the battery case assembly 30 alone.

The battery case assembly 30 may be detached from the power-assisted bicycle and brought indoors for charging the batteries 2. Even if the battery case assembly 30 is positioned on the power-assisted bicycle or removed from the power-assisted bicycle, the remaining amount of electric energy stored in the batteries 2 can be displayed. The detecting means may have a Rom therein which stores tables of data of the characteristics shown in FIGS. 4 and 5. The integrating means may have a ROM therein which stores a table of data of the characteristics shown in FIG. 6.

The amounts of electric energy stored in the battery at the predetermined discharged time and the predetermined fully charged time may be inputted in advance to the integrating means. The display elements 51–55 may comprise LCDs 27 rather than the LEDs.

In the remaining battery energy indicating instrument according to the present invention, the display means may comprise a digital display unit, or LEDs or LCDs for displaying a circular graph or a moving-coil meter. While the remaining battery energy indicating instrument for a battery which stores electric energy for producing power for a power-assisted bicycle has been described in the illustrated embodiment, the present invention may be applied to a remaining battery energy indicating instrument for a battery which stores electric energy for producing power for an electrically operated apparatus such as an electric vehicle, an electric scooter, or the like.

In the future, the present invention may be applied to a remaining battery energy indicating instrument for a battery which stores electric energy for storing electric energy for producing power for a motorboat.

The illustrated embodiment is only an embodiment of the present invention, and the present invention is not limited to the illustrated embodiment.

A remaining battery energy indicating instrument according to the present invention includes a detecting means, an integrating means, and a display means, as described above. Since the integrating means integrates electric energy, with regard to an integrated value a value corresponding to an amount of electric energy stored in the battery at the F detection time and the E detection time when the F detection time and the E detection time are reached, an integration error may be smaller than if only the discharge completion time is used as a reference in the battery which is fully charged more often than fully discharged.

The remaining battery energy indicating instrument is capable of accurately displaying the absolute value of the amount of electric energy stored in the battery (the remaining amount of electric energy in the battery) from the F detection time to the E detection time. For example, if the battery capacity or its rated value is 5 Ah, the amount of electric energy stored in the battery at the F detection time is 80% (4 Ah) thereof, and the amount of electric energy stored in the battery at the E detection time is 10% (0.5 Ah) thereof, then the remaining battery energy indicating instrument is effective in accurately displaying the absolute value of the remaining amount of electric energy stored in the battery between the F and E detection times.

If the integrating means starts integrating electric energy, using as an integrated value a value corresponding to the amount of electric energy stored in the battery at the F detection time, then the integrating means may be simpler in arrangement than if it started integrating electric energy, using as integrated values a plurality of values corresponding to respective amounts of charged electric energy in a fully charged state.

This is because the detecting means is not required to output a specific amount of electric energy stored in the battery at the F detection time to the integrating means.

If the integrating means starts integrating electric energy, using as an integrated value a constant value corresponding to the amount of electric energy stored in the battery at the F detection time, then the integrating means may provide a higher accuracy of display of the remaining amount of electric energy stored in the battery from the F detection time to the E detection time, than if it started integrating electric energy, using as integrated values a plurality of values corresponding to respective amounts of charged electric energy in a fully charged state.

This is because the integrating means does not accumulate integration errors due to corrective factors from the respective amounts of charged electric energy in the fully charged state to the amount of electric energy stored in the battery at the F detection time.

Since the display means displays the absolute value of the remaining amount of electric energy stored in the battery based on an output signal from the integrating means, the user of an electrically operated apparatus which uses the battery as an energy power source is able to recognize easily the remaining operating time or the like of the electrically operated apparatus.

In an remaining battery energy indicating instrument according to the present invention, the integrating means stops integrating the electric energy when the detecting means detects the amount of electric energy stored in the battery as being equal to or greater than the amount of electric energy stored in the battery at the fully charged time. Therefore, even if a battery charger remains connected to the battery for a long period of time while the battery is being fully charged and an electric current flows into the battery, the integrated value is fixed to a value which corresponds to the amount of charged electric energy at the fully charged time. An error of the integrated value in the fully charged state is thus held to a value equal to or smaller than the difference between the amount of charged electric energy at the fully charged time and the battery capacity. For example, the remaining battery energy indicating instrument is effective in displaying the remaining amount of electric energy stored in the battery as a digital value.

In an remaining battery energy indicating instrument according to the present invention, the display means displays an amount of electric energy equal to or smaller than the amount of electric energy stored in the battery at the predetermined fully charged time. Therefore, even when the capacity of the battery varies in a range equal to or greater than the amount of electric energy at the fully charged time, the display means can display the remaining amount of electric energy stored in the battery without being affected by the variation.

An uppermost display element for displaying the fully charged state can absorb a variation in the battery capacity or the chargeable capacity of the battery in each cycle, and display the fully charged state. Therefore, in the fully charged state, all display elements display the amount of electric energy in the battery at all times, preventing the battery from being charged in the fully charged state and wasting time. This prevents an upper from failing to display the amount of electric energy in the battery even if the battery is in the fully charged state, and also prevents a battery charger from excessively charging the battery and wasting time.

Inasmuch as the remaining amount of electric energy in the battery is displayed with a bar-graph meter, the space required for display is small in size, and the user of an electrically operated apparatus can visually recognize quickly an approximate value of the remaining amount of electric energy in the battery. The user can easily recognize the remaining operating time of the electrically operated apparatus before or while the electrically operated apparatus operates.

The remaining battery energy indicating instrument according to the present invention is applied to a battery for storing electric energy for producing power for an electrically operated vehicle. Therefore, an integration error may be considerably smaller than if only the discharge completion time is used as a reference in the battery which is fully charged more often than fully discharged.

Since the display means displays the absolute value of the remaining amount of electric energy in the battery, the driver of an electric vehicle can easily recognize the distance that the electric vehicle can travel before or while the driver drives the electric vehicle.

If the remaining amount of electric energy in the battery is displayed by a bar-graph meter, then the space required for display is small in size. Therefore, a space for installing the remaining battery energy indicating instrument according to the present invention can easily be kept in an electric vehicle which has a limited area for the installation of the meter. For example, a space for installing the remaining battery energy indicating instrument according to the present invention can easily be kept in a detachable battery or a battery case assembly on a power-assisted bicycle for which the appearance is important and which has a limited area for the installation of the meter.

If the remaining amount of electric energy in the battery is displayed by a bar-graph meter, then the driver of the electric vehicle can visually recognize quickly an approximate value of the remaining amount of electric energy in the battery, and can easily recognize the distance that the electric vehicle can travel while the driver is driving the electric vehicle. This offers a particularly great advantage because the driver can recognize quickly the remaining amount of electric energy in the battery while driving the electric vehicle at a high speed.

If the bar-graph meter comprises LEDs (light-emitting diodes) or light-emitting LCDs (liquid crystal or liquid crystal display), the user can confirm the remaining amount of electric energy in the battery and the charged amount of electric energy in the battery while on a road at night or in a dark place.

According to the present invention, as described above, the remaining battery energy indicating instrument suffers a reduced integration error and is highly convenient to use even if the battery is repeatedly charged and discharged without being fully discharged.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A remaining battery energy indicating instrument comprising:
   a detecting means for detecting a predetermined discharged time and a predetermined fully charged time of a battery for storing electric energy;
   an integrating means for integrating the amount of electric energy which has been charged and discharged, said integrating means utilizing an integrated value corresponding to an amount of electric energy stored in the battery at the predetermined discharged time and the predetermined fully charged time when the predetermined discharged time and the predetermined fully charged time are reached; and
   a display means for displaying the absolute value of a remaining amount of electric energy stored in the battery based on an output signal from said integrating means.

2. The remaining battery energy indicating instrument according to claim 1, wherein said integrating means stops integrating the electric energy when said detecting means detects the amount of electric energy stored in the battery as being equal to or greater than the amount of electric energy stored in the battery at the fully charged time.

3. The remaining battery energy indicating instrument according to claim 1, wherein said display means comprises a bar-graph meter for displaying an amount of electric energy equal to or smaller than the amount of electric energy stored in the battery at the fully charged time.

4. The remaining battery energy indicating instrument according to claim 2, wherein said display means comprises a bar-graph meter for displaying an amount of electric energy equal to or smaller than the amount of electric energy stored in the battery at the fully charged time.

5. The remaining battery energy indicating instrument according to claim 1, wherein the battery includes a battery for storing electric energy for producing power for an electrically operated vehicle.

6. The remaining battery energy indicating instrument according to claim 2, wherein the battery includes a battery for storing electric energy for producing power for an electrically operated vehicle.

7. The remaining battery energy indicating instrument according to claim 3, wherein the battery includes a battery for storing electric energy for producing power for an electrically operated vehicle.

8. A remaining battery energy indicating instrument comprising:
   a detector detecting a predetermined discharged time and a predetermined fully charged time of a battery for storing electric energy;
   an integrator integrating the amount of electric energy which has been charged and discharged, said integration means utilizing an integrated value corresponding to an amount of electric energy stored in the battery at the predetermined discharged time and the predetermined fully charged time when the predetermined discharged time and the predetermined fully charged time are reached; and
   a display device displaying the absolute value of a remaining amount of electric energy stored in the battery based on an output signal from said integrator.

9. The remaining battery energy indicating instrument according to claim 8, wherein said integrator stops integrating the electric energy when said detector detects the amount of electric energy stored in the battery as being equal to or greater than the amount of electric energy stored in the battery at the fully charged time.

10. The remaining battery energy indicating instrument according to claim 8, wherein said display device comprises a bar-graph meter for displaying an amount of electric energy equal to or smaller than the amount of electric energy stored in the battery at the fully charged time.

11. The remaining battery energy indicating instrument according to claim 9, wherein said display device comprises a bar-graph meter for displaying an amount of electric energy equal to or smaller than the amount of electric energy stored in the battery at the fully charged time.

12. The remaining battery energy indicating instrument according to claim 8, wherein the battery includes a battery for storing electric energy for producing power for an electrically operated vehicle.

13. The remaining battery energy indicating instrument according to claim 9, wherein the battery includes a battery for storing electric energy for producing power for an electrically operated vehicle.

14. The remaining battery energy indicating instrument according to claim 10, wherein the battery includes a battery for storing electric energy for producing power for an electrically operated vehicle.

15. A method of detecting a remaining battery energy comprising the following steps:
   detecting a predetermined discharged time and a predetermined fully charged time of a battery for storing electric energy;

storing as an integrated value corresponding to an amount of electric energy stored in the battery at the predetermined discharged time and the predetermined fully charged time when the predetermined discharged time and the predetermined fully charged time are reached;

integrating electric energy which has been charged and discharged based on said integrated value;

generating an output signal from said integrating of said electric energy; and displaying the absolute value of a remaining amount of electric energy stored in the battery based on said output signal from said integrating of said electric energy.

16. The method of detecting the remaining battery energy according to claim 15, wherein said integrating stops integrating the electric energy when said detecting detects the amount of electric energy stored in the battery as being equal to or greater than the amount of electric energy stored in the battery at the fully charged time.

17. The method of detecting the remaining battery energy according to claim 15, wherein said displaying comprises a bar-graph meter for displaying an amount of electric energy equal to or smaller than the amount of electric energy stored in the battery at the fully charged time.

18. The method of detecting the remaining battery energy according to claim 16, wherein said displaying comprises a bar-graph meter for displaying an amount of electric energy equal to or smaller than the amount of electric energy stored in the battery at the fully charged time.

19. The method of detecting the remaining battery energy according to claim 15, wherein the battery includes a battery for storing electric energy for producing power for an electrically operated vehicle.

20. The method of detecting the remaining battery energy according to claim 16, wherein the battery includes a battery for storing electric energy for producing power for an electrically operated vehicle.

\* \* \* \* \*